United States Patent
O'Riordan et al.

(10) Patent No.: US 8,996,348 B1
(45) Date of Patent: Mar. 31, 2015

(54) SYSTEM AND METHOD FOR FAULT SENSITIVITY ANALYSIS OF DIGITALLY-CALIBRATED-CIRCUIT DESIGNS

(71) Applicant: Cadence Design Systems, Inc., San Jose, CA (US)

(72) Inventors: Donald J. O'Riordan, San Jose, CA (US); Victor Zhuk, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 317 days.

(21) Appl. No.: 13/683,853

(22) Filed: Nov. 21, 2012

(51) Int. Cl.
*G06F 17/50* (2006.01)

(52) U.S. Cl.
CPC .................. *G06F 17/5045* (2013.01)
USPC ............. 703/13; 716/112; 716/116; 716/136

(58) Field of Classification Search
USPC ........ 703/13, 24; 716/106, 112, 102; 714/733
See application file for complete search history.

(56) References Cited

U.S. PATENT DOCUMENTS

| | | | |
|---|---|---|---|
| 4,937,765 A * | 6/1990 | Shupe et al. .................. | 702/187 |
| 5,084,824 A | 1/1992 | Lam et al. | |
| 5,157,668 A | 10/1992 | Buenzli et al. | |
| 5,325,309 A | 6/1994 | Halaviati et al. | |
| 5,475,695 A | 12/1995 | Caywood et al. | |
| 6,009,251 A | 12/1999 | Ho et al. | |
| 6,035,114 A | 3/2000 | Tseng et al. | |
| 6,367,043 B1 * | 4/2002 | Damarla ....................... | 714/733 |
| 6,611,948 B1 | 8/2003 | Tyler et al. | |
| 7,103,434 B2 | 9/2006 | Chernyak et al. | |
| 7,117,471 B1 | 10/2006 | Li et al. | |
| 7,296,249 B2 | 11/2007 | Rinderknecht et al. | |
| 7,472,051 B2 | 12/2008 | Mariani et al. | |
| 7,562,321 B2 | 7/2009 | Wang et al. | |
| 7,716,611 B2 | 5/2010 | Pikus et al. | |
| 8,683,400 B1 * | 3/2014 | O'Riordan et al. ........... | 716/106 |
| 8,705,298 B2 * | 4/2014 | Ling et al. ..................... | 365/200 |
| 8,813,004 B1 * | 8/2014 | O'Riordan et al. ........... | 716/102 |
| 2004/0060017 A1 | 3/2004 | Abdennadher | |
| 2006/0041417 A1 | 2/2006 | Palladino | |
| 2008/0276206 A1 | 11/2008 | Mariani | |
| 2010/0229061 A1 | 9/2010 | Kapke et al. | |
| 2010/0257494 A1 | 10/2010 | Pouarz et al. | |
| 2013/0054161 A1 | 2/2013 | Kapke et al. | |
| 2014/0059507 A1 | 2/2014 | Sunter | |

OTHER PUBLICATIONS

Mei, Kenyon C.Y., "Bridging and Stuck-At Faults," IEEE Transaction on Computers, vol. c-23, No. 7, Jul. 1974, pp. 720-727.
Ferguson, F. Joel, et al., "Test Pattern Generation for Realistic Bridge Faults in CMOS ICs," IEEE International Test Conference, Oct. 1991, pp. 492-499.

(Continued)

*Primary Examiner* — Thai Phan
(74) *Attorney, Agent, or Firm* — Kenyon & Kenyon LLP

(57) ABSTRACT

An apparatus and method for conducting fault sensitivity analysis of a digitally calibrated circuit design includes simulating calibration of the circuit design, simulating calibration of the circuit design with a fault in the analog portion of the circuit design, simulating the circuit design with the fault for a fault interval time period, and determining whether the fault is detectable.

20 Claims, 7 Drawing Sheets

(56) References Cited

OTHER PUBLICATIONS

Spinner, Stefan, et al., "Automatic Test Pattern Generation for Interconnect Open Defects," 26th IEEE VLSI Test Symposium, Apr. 2008, pp. 181-186.

Waicukauski, John A., et al., "Transition Fault Simulation," IEEE Design & Test of Computers, Apr. 1987, pp. 32-38.

Pomeranz, Irith, et al., "On n-Detection Test Sets and Variable n-Detection Test Sets for Transition Faults," in Proc. of VTS, Apr. 1999, pp. 173-180.

Geuzebroek, Jeroen, et al., "Embedded Multi-Detect ATPG and Its Effect on the Detection of Unmodeled Defects," IEEE ITC, Oct. 2007, paper 30.3, pp. 1-10.

Cho, Kyoung Youn, et al., "Gate Exhaustive Testing," IEEE, ITC, paper 31.3, Nov. 2005, pp. 1-7.

Hapke, F., et al., "Defect-Oriented Cell-Aware ATPG and Fault Simulation for Industrial Cell Libraries and Designs," IEEE ITC, Nov. 2009, paper 1.2, pp. 1-10.

Hapke, F., et al., "Cell-Aware Production Test Results from a 32-nm Notebook Processor," IEEE ITC, Nov. 2012, paper 1.1, pp. 1-9.

Piet Engelke et al., "Resistive Bridging Fault Simulation of Industrial Circuits", Design, Automation and Test in Europe, Aug. 2008, p. 628-633.

Yuyun Liao and D.M.H. Walker, "Fault Coverage Analysis for Physically-Based CMOS Bridging Faults at Different Power Supply Voltages", Proceedings 1996 IEEE International Test Conference, Test and Design Validity, Washington, D.C., USA, Oct. 20-25, 1996, p. 767-775.

R. Rodriguez-Montanes, E.M.J.G. Bruls, J. Figueras, "Bridging Defects Resistance Measurements in a CMOS Process", Proceedings, IEEE International Test Conference 1992, Paper 41.3, 0-8186-3167, Aug. 1992, p. 892-899.

Vijay R. Sar-Dessai and D.M.H. Walker, "Resistive Bridge Fault Modeling, Simulation and Test Generation", Proceedings, 1999 IEEE ITC International Test Conference, Paper 23.2, 0-7803-5753, Jan. 1999, p. 596-605.

Bram Kruseman et al., "Defect Oriented Testing for Analog/Mixed-Signal Devices", 2011 IEEE International Test Conference, Paper 1.1, 978-1-4577-0152, Aug. 2011, p. 1-10.

* cited by examiner

SYSTEM AND METHOD FOR FAULT SENSITIVITY ANALYSIS OF DIGITALLY-CALIBRATED-CIRCUIT DESIGNS

CROSS REFERENCE TO RELATED APPLICATIONS

The present application is related to U.S. application Ser. No. 13/683,810, entitled "System and Method For Fault Sensitivity Analysis Of Mixed-Signal Integrated Circuit Designs", filed on Nov. 21, 2012 and issued as U.S. Pat. No. 8,683,400 on Mar. 25, 2014. This related application is hereby incorporated by reference in its entirety.

The present application also is related to U.S. application Ser. No. 13/683,889, entitled "Analog Fault Visualization System and Method For Circuit Designs", filed on Nov. 21, 2012 and issued as U.S. Pat. No. 8,813,004 on Aug. 19, 2014. This related application is hereby incorporated by reference in its entirety.

BACKGROUND

The integrated circuit ("IC") industry faces the challenge of reducing yield loss caused by defects during manufacturing. These defects can be either random defects or systematic defects. Random defects, as the name implies, result from random occurrences such as particulate contamination. Systematic defects are non-random and result from problems with the manufacturing process and/or IC design. Systematic defects will recur when a manufacturer uses a similar process or IC design. A designer may be able to categorize or anticipate certain systematic defects based on a shape or feature pattern on an IC.

To aid in diagnosing the root cause of a defect, companies have developed tools for detecting defects in ICs, helping IC designers and/or manufacturers reduce the number of defects in an IC, and thereby reduce yield loss. However, these tools conduct logic-level simulations which are inapplicable to the analog portions of an IC. In the past, IC design focused on digital circuits with little or no analog parts. A designer would diagnose faults in analog circuitry through in-line inspection.

Today, the IC industry is developing more and more mixed signal ICs with substantial analog circuitry. The IC industry is also moving to smaller and smaller IC features. Manufacturing mixed signal ICs with sub-90 nm processes have many subtle design process variations which increase the types of systematic defects present in the analog circuitry.

As a result, designers are unable to adequately diagnose all of the new defect types using in-line inspection. While better tools for diagnosing faults in analog circuitry are being developed, these tools have particular difficulties with diagnosing digitally calibrated circuits.

Digitally calibrated circuits are self measuring circuits that use algorithms to configure the circuits for a certain operating state. Some circuits may use a voltage reference generator to calibrate the voltage applied to a circuit, or a voltage controlled oscillator (VCO) to calibrate the frequency of a circuit's operation. Digitally calibrated circuits may calibrate voltages, current, capacitance, inductance, resistance, frequencies, etc. FIG. 1 shows just one example of one particular digitally calibrated circuit.

FIG. 1 shows a digitally calibrated VCO 100, which can be used to calibrate operating frequencies. Switch matrix 101 receives digital inputs and provides a voltage output based on the digital code, much like a digital to analog converter. Varactors 102 are voltage controlled capacitors. Depending on the inputs provided to the switch matrix 101, certain voltage or voltages will be applied to varactors 102, to set the capacitance of varactors 102. The capacitance of the varactors will affect the oscillation frequency of VCO 100. VCO 100 may use a digital assist loop, which may determine the initial frequency of the circuitry and use a binary search algorithm to find the best operational setting.

FIG. 2 is a graph illustrating a oscillator operation of a digitally calibrated VCO during startup. Codes 201 are the digital codes that set the VCO frequency. As can be seen on the graph, these code values change over time during calibration. Voltage response 202 is a graph of the voltage output. Frequency output 203 is a graph of the operating frequency. In this example, the calibration determines that digital code 4 provides the optimal operating frequency, which is around 2 MHz.

Looking a little more closely at FIG. 2, at time 0.0 the circuit is initiated at an initial code 0. After a short period of time, the circuit reaches a steady frequency state of about 2.75 MHz. Code 0, in this case, causes the circuit to oscillate at a frequency close to 2.75 MHz. In this example, the higher the code numbers, the lower the frequency. In this example, the digital assist loop is using a binary search, so the next code used is 8 (halfway between 0 and 16). Code 8 reaches a steady state of 1.75 MHz, which is too low. The digital assist loop thus uses code 4 (half way between 8 and 0). Code 4's frequency is a little too high, so the digital assist loop attempts the halfway point between code 8 and code 4, code 6. Code 6 uses a frequency too low, so the halfway point between 4 and 6 is used, code 5. Code 4 is closer to the desired frequency than code 5, so the digital calibration settles on code 4 as providing the best operating frequency. The VCO example is a circuit which calibrates for operating frequencies. There are many other digital calibration circuits with different calibration algorithms.

Defects in a circuit may cause faults that affect the circuit response for different digital codes during calibration. Tools that test for faults without accounting for the relationship between the faulty circuit and the calibration may cause misleading results. Thus there is a need for a tool that accurately diagnoses defects in digitally calibrated circuits

DETAILED DESCRIPTION

As will be described hereinafter in greater detail, one aspect of the present invention relates to a fault sensitivity analysis system and method for accurately analyzing faults in digitally calibrated mixed signal ICs. For purposes of explanation, specific nomenclature is set forth to provide a thorough understanding of the present invention. Description of specific applications and methods are provided only as examples. Various modifications to the embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

Figure 3:
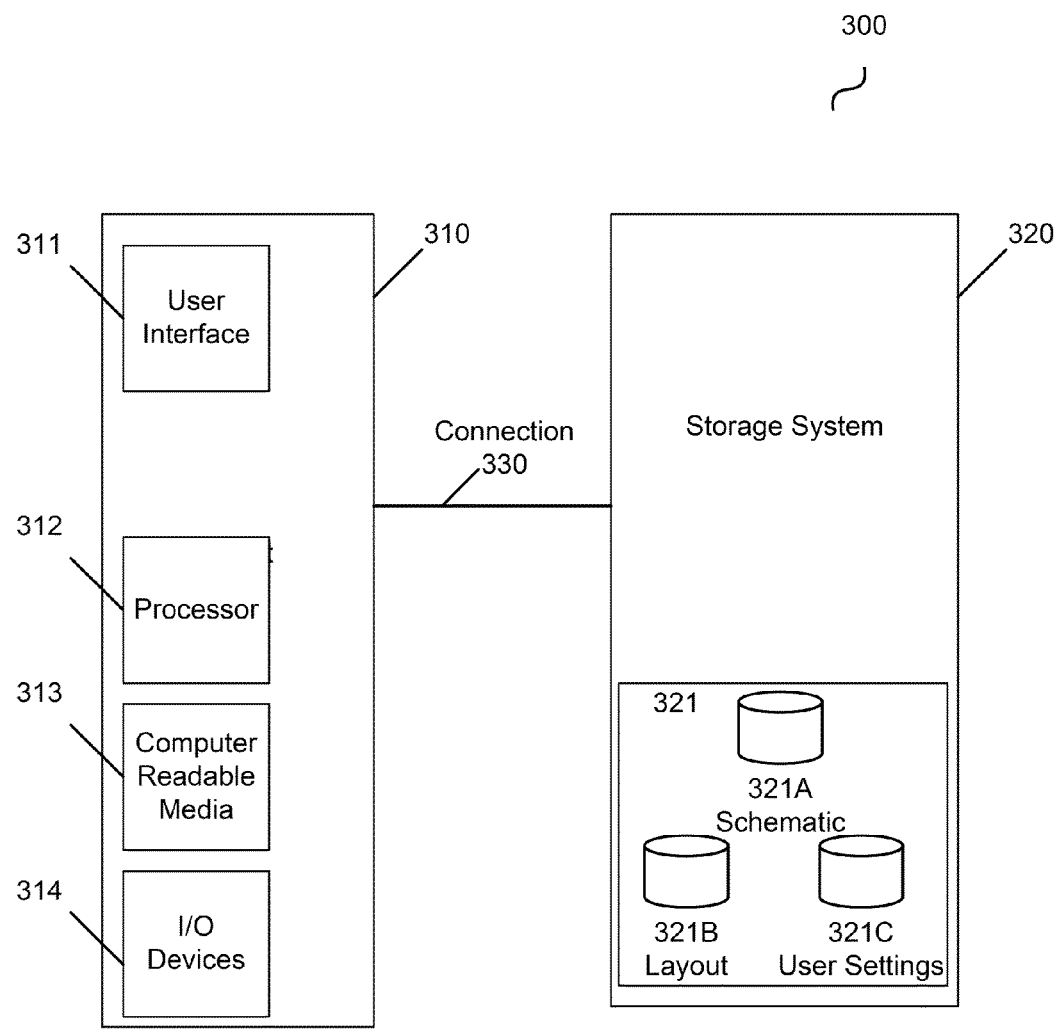
FIG. 3 is a block diagram illustrating components of a fault sensitivity analysis system for digitally-calibrated-circuit design.

FIG. 3 is a block diagram illustrating components of an exemplary system 300 for conducting fault sensitivity analysis for a digitally-calibrated-circuit design according to an embodiment. This system may provide simulator functionality, as will be discussed in greater detail below. A user may access the system for conducting fault sensitivity analysis for a digitally-calibrated-circuit design through a standalone client system, client-server environment, or a network environment. System 300 may comprise one or more clients or servers 310, one or more storage systems 320, and a connection or connections 330 between and among these elements.

Client 310 may execute instructions stored on a computer readable medium that provides a user interface 311 which allows a user to access storage system 320. According to an aspect of an embodiment, the instructions may be part of a software program or executable file that operates EDA software. Client 310 may be any computing system, such as a personal computer, workstation, or other device employing a processor which is able to execute programming instructions. User interface 311 may be a GUI run in a user-controlled application window on a display. A user may interact with user interface 311 through one or more input/output (I/O) devices 314 such as a keyboard, a mouse, or a touch screen.

Storage system 320 may take any number of forms, including but not limited to a server with one or more storage devices attached to it, a storage area network, or one or a plurality of non-transitory computer readable media. In an aspect of one embodiment, databases 321 may be stored in storage system 320 such that they may be persistent, retrieved, or edited by the user. Databases 321 may have a schematic database 321A, a layout database 321B, and a user input database 121C. These databases may be kept as separate files or systems, or may be merged together in any appropriate combination.

According to an aspect of an embodiment, only one client 310 is connected to storage system 320 through connection 330, which may be a simple direct wired or wireless connection, a system bus, a network connection, or the like, to provide client 310 with access to storage system 320. In another aspect, connection 330 may enable multiple clients 310 to connect to storage system 320. The connection may be part of a local area network, a wide area network, or another type of network, again providing one or more clients with access to storage system 320. Depending on system administrator settings, client 310's access to system storage 320 or to other clients may be limited.

Figure 4:
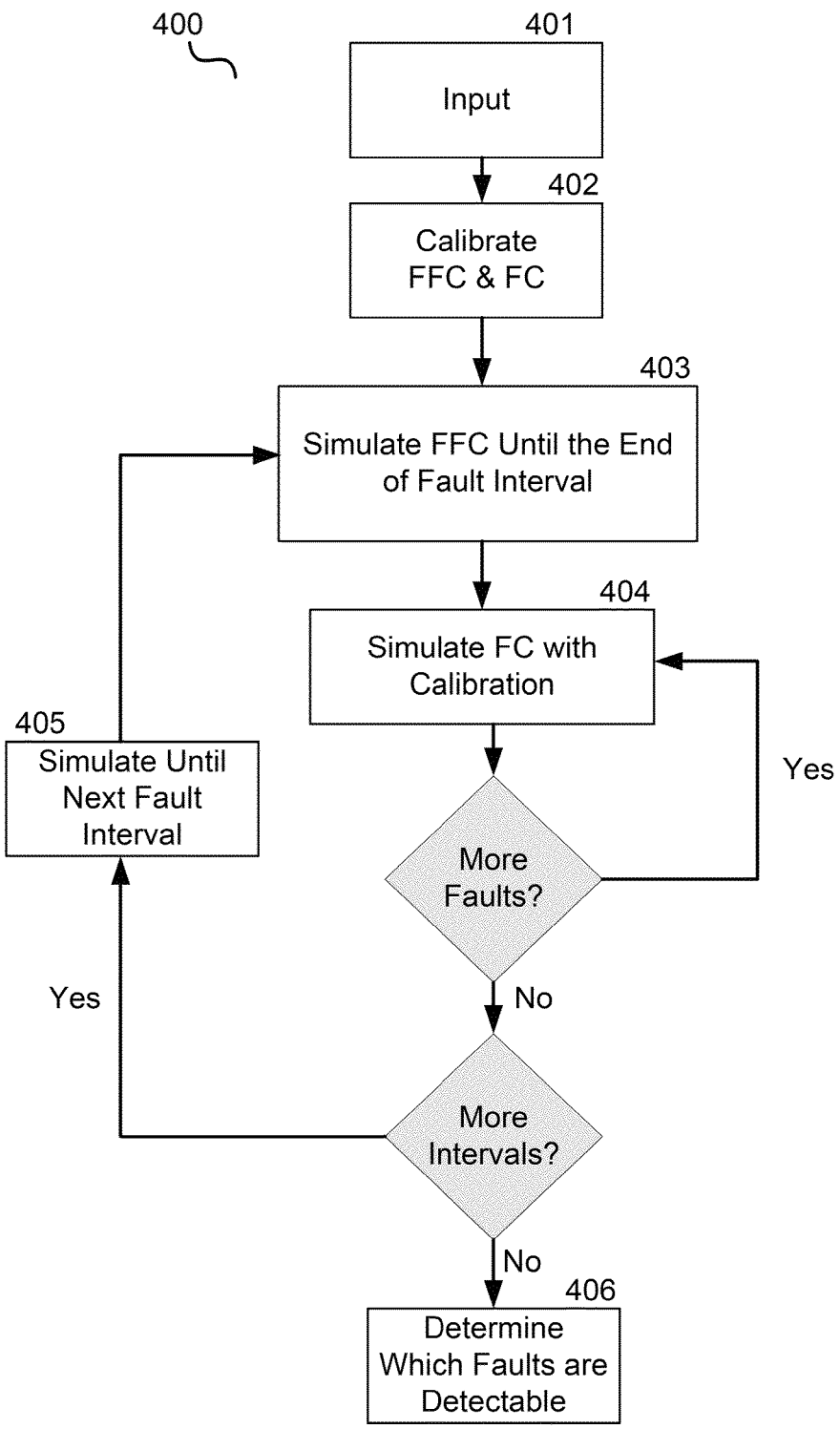
FIG. 4 is a flow chart illustrating an implementation of conducting fault sensitivity analysis FSA 400 on a digitally-calibrated-circuit design according to an embodiment.

FIG. 4 is a flow chart illustrating an implementation of conducting fault sensitivity analysis FSA 400 according to an embodiment. At 401, a user may provide inputs to conduct the fault sensitivity analysis. The inputs may include a digitally-calibrated-circuit design, faults, time intervals for injecting faults, circuit nodes of interest, one or more intervals of time where the circuit is calibrated (calibration intervals), and lengths of time for the calibration decisions. Nodes of interest may include nodes that are calibrated or monitored during calibration, nodes which represent the digital calibration code values, nodes which are driven to establish the calibrated circuit state, and nodes for observing faults.

At 402, FSA 400 simulates a calibration of the circuit design for the fault free circuits (FFC) and each of the faulty circuits (FC). Once calibration is completed, FSA 400 at 403 continues the fault-free simulation until the end of a fault interval. At 404, FSA 400 simulates the faulty circuit using stored calibration settings saved in 402. At 405, FSA 400 continues simulating the fault free circuit until the next fault interval. Steps 404-405 are repeated until all FSA 400 analyzes every fault at every fault interval. At that point, FSA 400 advances to 406, and determines which faults are detectable. In one embodiment, FSA determines which faults are detectable by comparing the fault free circuit simulation with the faulty circuit simulation. FSA 400 may consider a fault detectable if there are significant differences between the fault free scenario and the faulty scenario.

Figure 1:
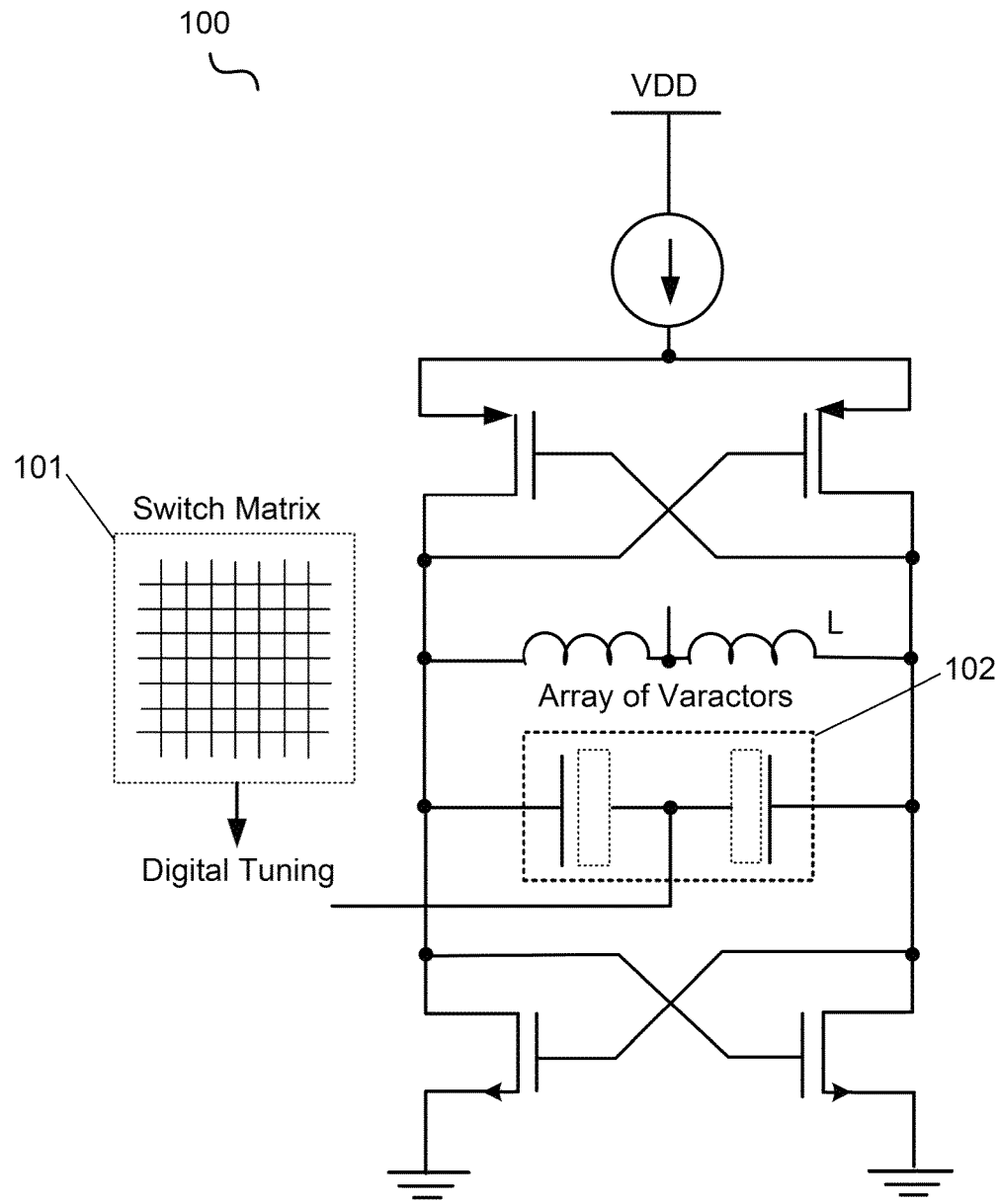
FIG. 1 is an example of a digitally calibrated Voltage Controlled Oscillator.
Figure 2:
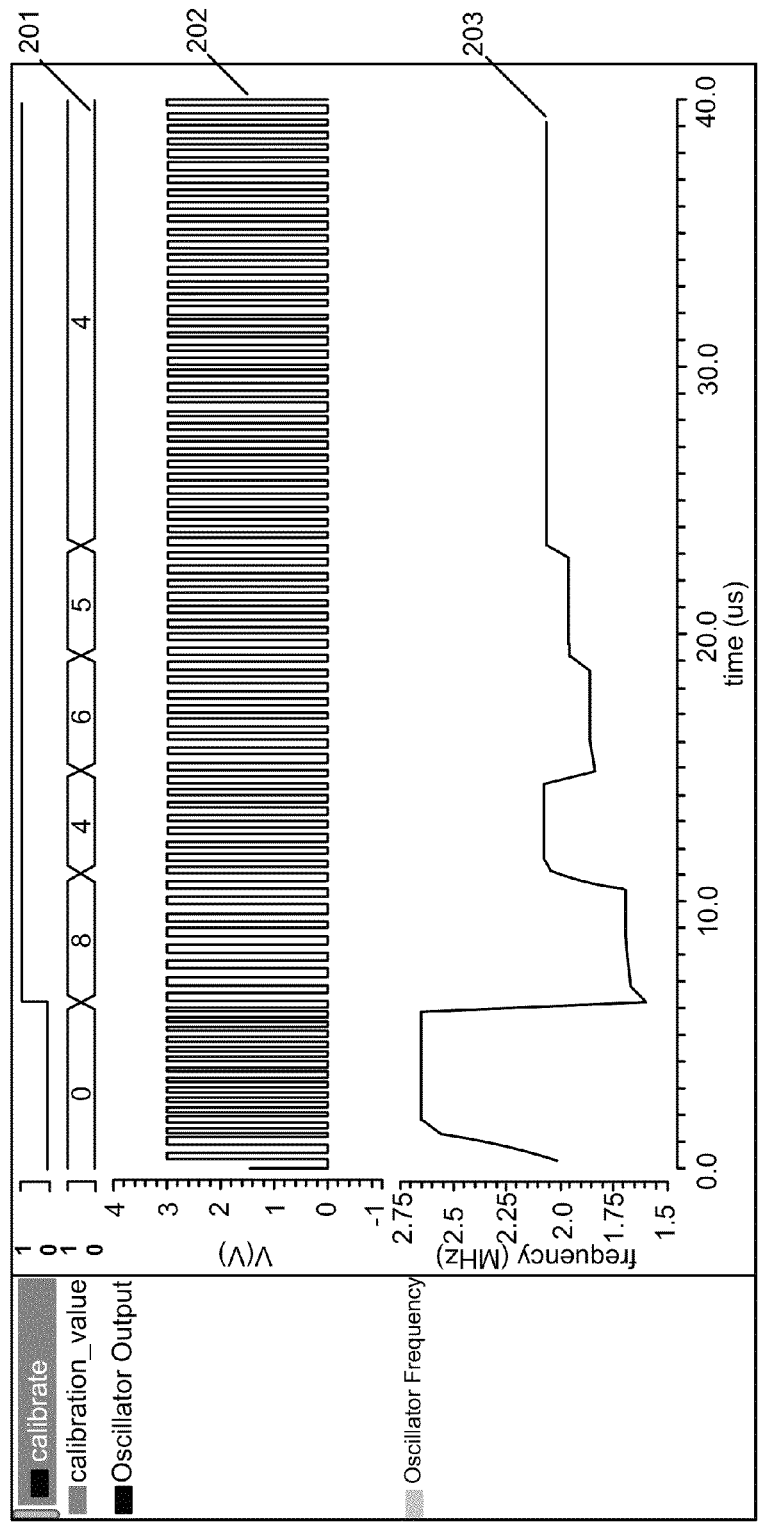
FIG. 2 is a graph illustrating a calibration of a digitally calibrated Voltage Controlled Oscillator.
Figure 5:
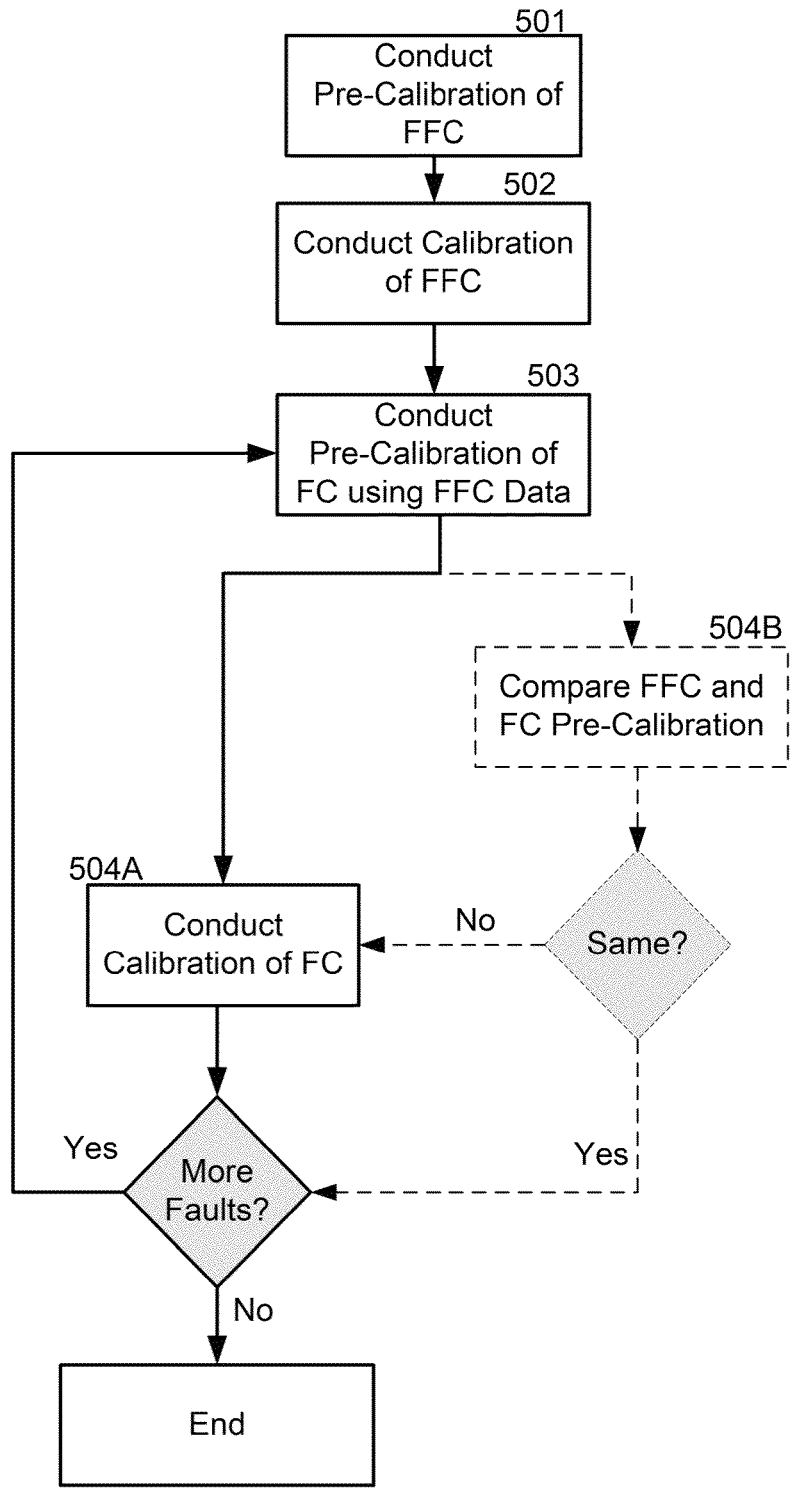
FIG. 5 is a flow chart of conducting the calibration 402 in FIG. 4 according to an embodiment.

FIG. 5 is a flow chart describing calibration 402 in FIG. 4 according to an embodiment. At 501, FSA 400 simulates pre-calibration for the fault free circuit. Simulation may be done with any circuit level simulator including but not limited SPICE, FastSPICE, analog circuit simulator, or mixed-signal circuit simulator. The simulator may be any simulator which may simulate the characteristics of a circuit design in response to an application of a simulated stimulus and load. The simulator may be part of an EDA software application. As noted earlier, the system 300 in FIG. 1 may function as a simulator, among other things. Pre-calibration is a short interval after a simulated stimulus and load. During that interval, an initial calibration code may be applied to the circuit for the circuit to settle into a steady state. At the end of the pre-calibration interval, FSA 400 saves the state of the circuit at each node being monitored. The state may include a plurality of values including voltages, currents, frequencies, etc. At 502, calibration of the fault free circuit is conducted and each digital calibration code and node value is recorded.

At 503, FSA 400 simulates pre-calibration for the faulty circuit. In one embodiment, FSA 400 starts the circuit with the fault free circuit state saved in 501. Initiating the pre-calibration simulation with the fault free data points may speed up FSA 400's arrival to the pre-calibration solution for the faulty circuit.

At 504A, FSA 400 simulates calibration for each faulty circuit and saves the calibration codes and node values. In an alternative embodiment, depicted with dashed lines, calibration of the faulty circuit may be skipped for certain circuits. In this embodiment, at 504B, FSA 400 may compare the pre-calibration solution of the fault free circuit against the faulty circuits. FSA 400 may skip calibration for the faulty circuits that have pre-calibration values close to or identical to the fault free circuit pre-calibration values. FSA 400 may use the calibrations of the fault free circuit for faulty circuits that have similar pre-calibration solutions.

Figure 6:
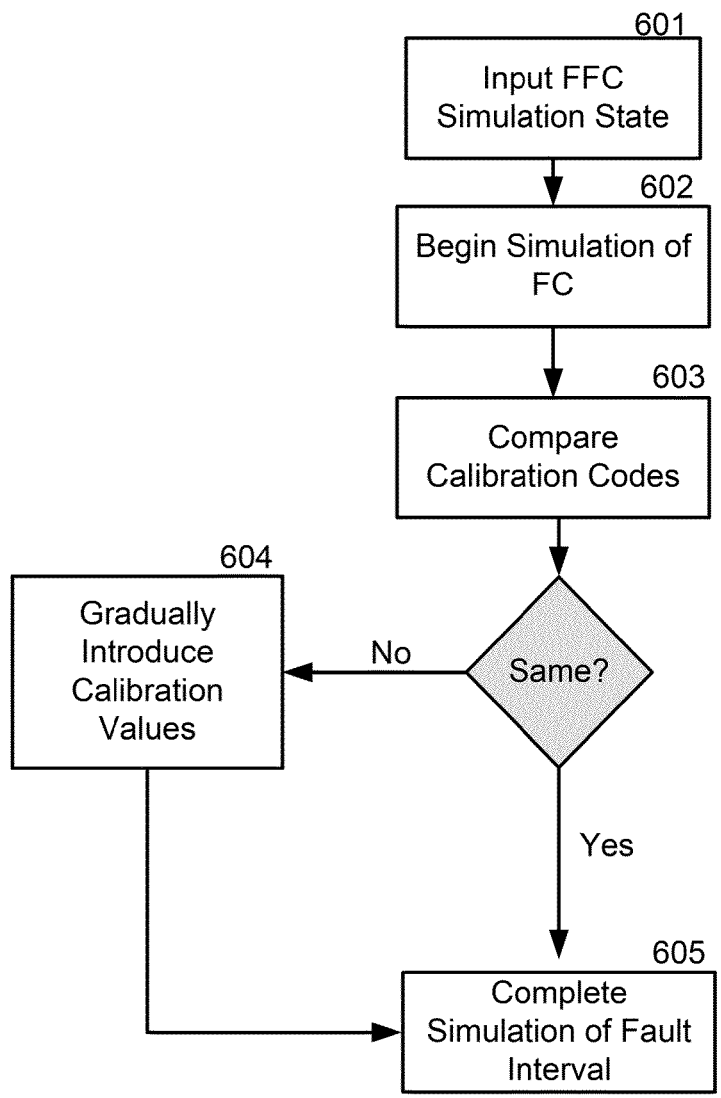
FIG. 6 is a flow chart of the fault interval simulation for a faulty circuit according to an embodiment.

FIG. 6 is a flow chart of the fault interval simulation at 404 in FIG. 4 according to an embodiment. At 601, FSA 400 initiates the faulty circuit state with the state of the fault free circuit determined at the beginning of the fault interval. At 602, FSA 400 begins simulation of the fault interval. At 603, calibration codes for the fault free circuit and the faulty circuit, determined during calibration, are compared. If the calibration codes differ, FSA 400 gradually introduces the calibration values for the faulty circuit during simulation of the fault interval at 604. In one embodiment, calibration values are introduced gradually over a period of 25% of the fault interval. The gradual introduction of the calibration values of the faulty circuit may be simulated by connecting a voltage or current source to the affected nodes through a high-value resistor and gradually reducing the resistor's resistance to a small value close to or equal to zero. At 605, FSA 400 simulates the rest of the fault interval and saves the circuit state. If, on the other hand, the calibration codes for the fault free circuit and faulty circuit were the same, 604 may be skipped. In an alternative embodiment, the faults in the faulty circuit also may be gradually introduced. For example, a short circuit may be gradually introduced by inserting a high value resistor and slowly decreasing the resistance to zero. The methods of gradually introducing calibration values and faults are only provided as an example. Other forms of gradually introducing faults and calibration values exist and would be known by someone skilled in the art.

Figure 7:
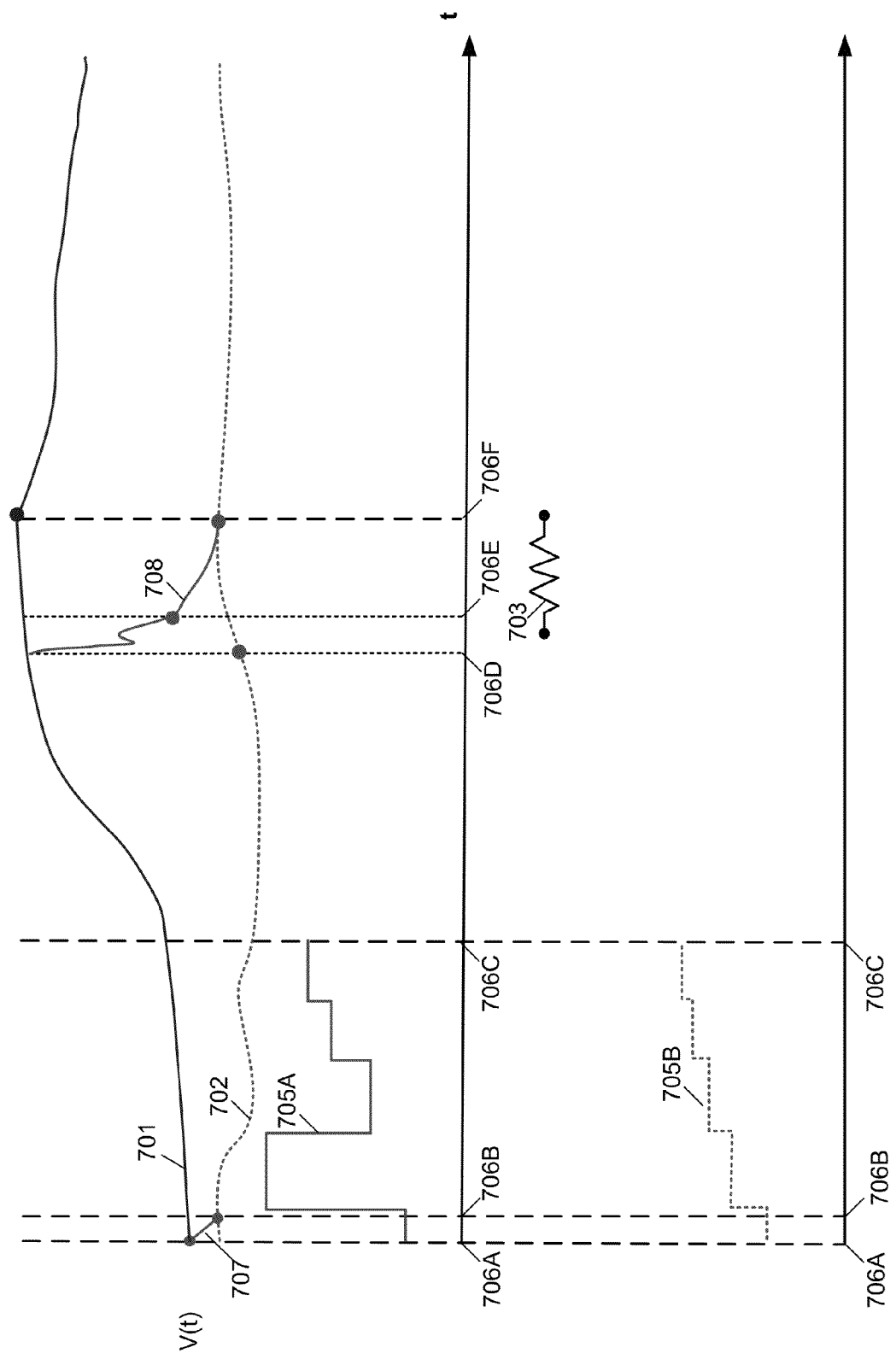
FIG. 7 is an exemplary transient graph of a simulated circuit response for a digitally calibrated circuit used to describe a method of fault sensitivity analysis of a digitally calibrated circuit.

FIG. 7 is an exemplary transient graph, to aid in visualizing fault sensitivity analysis for a digitally calibrated circuit according to an embodiment. FIG. 7 traces an exemplary simulation of a circuit using FSA 400 with the calibration method in FIG. 5 and fault interval simulation method in FIG. 6. This particular example shows a graph of the simulated circuit's voltage response (y axis) over time (x axis). There are many ways to graph transient solutions, including but not limited to current over time and frequency over time. FIG. 7 is only provided as a visual aid for demonstrating an implementation of the fault sensitivity analysis method according to an embodiment.

In FIG. 7, solid line 701 graphs the voltage response of the fault free circuit during simulation. Dashed line 702 represents the true voltage response of the circuit with fault 703. Solid line 705A is a graph of the digital calibration conducted for the fault free circuit. Dotted line 705B is a separate graph of the digital calibration for the faulty circuit.

FSA 400 first conducts pre-calibration of the fault free circuit. The pre-calibration solution for the fault free circuit is represented by line 701 between time 706A and 706B. Solid line 701 between 706A and 706B is the voltage response of the circuit during simulation of the pre-calibration for the fault free circuit. Next, FSA 400 calibrates the fault free circuit during the calibration interval, here, between time 706B and 706C. Solid line 705A depicts the calibration values used during the calibration of the fault free circuit. Each step in line 705A represents a different calibration code value. The calibration graphical lines may not match up with the voltage response because the calibration may be done at a different point in the circuit, or may be a frequency response or a current response instead of a voltage response.

Next, FSA 400 inserts fault 703 into the analog portion of the circuit design and conducts pre-calibration on the faulty circuit. Solid line 707 is the voltage response of the faulty circuit during simulation of the pre-calibration. Solid line 707 starts at the same position as the fault free initial point because, in this example, pre-calibration and calibration of the faulty circuit uses the initial state of fault free circuit pre-calibration for the faulty circuit pre-calibration. In this example, the simulation of the faulty circuit (solid line 707) is approximately the same as the true faulty circuit solution (dashed line 702) by simulation time 706B. The voltage response during pre-calibration for the fault free circuit and faulty circuit are different. Therefore, the calibration codes and values for the fault free circuit might not be the same as the faulty circuit. If the responses had been the same, one embodiment of FSA 400 may have skipped the calibration of the faulty circuit.

Next, FSA 400 conducts a calibration for the faulty circuit as represented by dotted line 705B. Because the steps in the in the faulty circuit calibration are different from those in the fault free circuit, the two simulations will have different calibration code solutions.

FSA 400 then simulates the fault free circuit until the end of the fault interval at time 706F. Line 701 between 706C to 706F represents FSA 400's simulation solution. Then, using the fault free solution's circuit state at time 706D, FSA 400 simulates the faulty circuit from the beginning of the fault interval at time 706D. In this example, a version of FSA 400 which gradually introduces the faulty calibration values and faulty circuit is used. FSA 400 initially starts the simulation of the faulty circuit with the state of the fault free circuit as determined at time 406D. The faulty circuit simulation is represented by solid line 708. FSA 400 then gradually implements the fault and calibration values for the faulty circuit until time 706E as shown by solid line 708 between time 706D and 706E. At time 706E, the fault and calibration code values should be fully implemented and FSA 400 finishes faulty circuit simulation at 706F. FSA 400 records the state of the faulty circuit and then continues the fault free simulation until the next fault injection point or ends the circuit simulation. FSA 400 would then compare its faulty circuit simulation solutions with the fault free simulation solutions to determine whether fault 703 is detectable.

While particular embodiments of the present invention have been described, it is to be understood that various different modifications within the scope and spirit of the invention are possible. The invention is limited only by the scope of the appended claims.

What is claimed is:

1. A computer implemented method for conducting fault sensitivity analysis of a digitally-calibrated circuit design, the method comprising:
   receiving a fault free digitally-calibrated circuit design, a fault, a fault interval time period, and a calibration interval time period;
   simulating calibration of the fault free digitally-calibrated circuit design;
   simulating calibration of the fault free digitally-calibrated circuit design with the fault integrated into an analog portion of the digitally-calibrated circuit design;
   simulating a circuit response of the fault free digitally-calibrated circuit design with a circuit simulator from after the calibration of the fault free digitally-calibrated circuit design until the end of the fault interval time period;
   simulating the fault free digitally-calibrated circuit design with the fault from the beginning of the fault interval time period until the end of the fault interval time period; and
   determining whether the fault is detectable.

2. The method of claim 1 wherein simulating the fault free digitally-calibrated circuit design with the fault from the beginning of the fault interval time period until the end of the fault interval time period comprises:
   applying a calibration value for the fault free digitally-calibrated circuit design with the fault integrated into the digitally-calibrated circuit design.

3. The method of claim 2 wherein applying a calibration value for the fault free digitally-calibrated circuit design with the fault integrated into the digitally-calibrated circuit design comprises:
   gradually introducing the calibration value over a period of time that is a fraction of the fault interval time period.

4. The method of claim 1 further comprising:
   pre-calibrating the fault free digitally-calibrated circuit design during the calibration interval; and pre-calibrating the fault free digitally-calibrated circuit design with the fault integrated into the digitally-calibrated circuit design during the calibration interval.

5. The method of claim 4 further comprising:
comparing a first circuit response at the end of the fault free digitally-calibrated circuit design pre-calibration with a second circuit response at the end of the fault free digitally-calibrated circuit design with the fault integrated into the circuit pre-calibration; and
when the first circuit response is the same as the second circuit response, replacing the calibration of the fault free digitally-calibrated circuit design with the fault integrated into the circuit with the calibration of the fault free digitally-calibrated circuit design.

6. The method of claim 4 wherein pre-calibrating the fault integrated digitally-calibrated circuit design during the calibration interval comprises:
using a circuit state during pre-calibration of the fault free digitally-calibrated circuit design.

7. The method of claim 1 wherein simulating the fault free digitally-calibrated circuit design with the fault from the beginning of the fault interval time period until the end of the fault interval time period comprises:
using a circuit state of the fault free digitally-calibrated circuit simulation as the initial state when simulating the fault free digitally-calibrated circuit design with the fault.

8. A non-transitory computer readable medium storing instructions that, when executed by a processor, perform a method for conducting fault sensitivity analysis of a digitally calibrated circuit design, the method comprising:
receiving a fault free digitally-calibrated circuit design for a digitally calibrated mixed signal integrated circuit, a fault, a fault interval time period, and a calibration interval time period;
simulating calibration of the fault free digitally-calibrated circuit design;
simulating calibration of the fault free digitally-calibrated circuit design with the fault integrated into an analog portion of the digitally-calibrated circuit design;
simulating a circuit response of the fault free digitally-calibrated circuit design with a mixed signal circuit simulator from after the calibration of the fault free digitally-calibrated circuit design until the end of the fault interval time period;
simulating the fault free digitally-calibrated circuit design with the fault from the beginning of the fault interval time period until the end of the fault interval time period; and
determining whether the fault is detectable.

9. The method of claim 8 wherein simulating the fault free digitally-calibrated circuit design with the fault from the beginning of the fault interval time period until the end of the fault interval time period comprises:
applying a calibration value for the fault free digitally-calibrated circuit design with the fault integrated into the circuit design.

10. The method of claim 9 wherein applying a calibration value for the fault free digitally-calibrated circuit design with the fault integrated into the digitally-calibrated circuit design comprises:
gradually introducing the calibration value over a period of time that is a fraction of the fault interval time period.

11. The method of claim 8 further comprising:
pre-calibrating the fault free digitally-calibrated circuit design during the calibration interval; and pre-calibrating the fault free digitally-calibrated circuit design with the fault integrated into the digitally-calibrated circuit design during the calibration interval.

12. The method of claim 11 further comprising:
comparing a first circuit response at the end of the fault free digitally-calibrated circuit design pre-calibration with a second circuit response at the end of the fault free digitally-calibrated circuit design with the fault integrated into the circuit pre-calibration; and
when the first circuit response is the same as the second circuit response, replacing the calibration of the fault free digitally-calibrated circuit design with the fault integrated into the digitally-calibrated circuit design with the calibration of the fault free digitally-calibrated circuit design.

13. The method of claim 11 wherein pre-calibrating the fault free integrated circuit design during the calibration interval comprises:
uses a circuit state during pre-calibration of the fault free digitally-calibrated circuit design.

14. The method of claim 8 wherein simulating the fault free circuit design with the fault from the beginning of the fault interval time period until the end of the fault interval time period comprises:
using a circuit state of the fault free digitally-calibrated circuit simulation as the initial state when simulating the fault free digitally-calibrated circuit design with the fault.

15. A system for conducting fault sensitivity analysis of a digitally calibrated circuit design, the method comprising:
a non-transitory computer-readable medium to store data of a fault free digitally-calibrated circuit design for a digitally calibrated mixed signal integrated circuit, a fault, a fault interval time period, and a calibration interval time period; and
a processor executing instructions to:
simulate calibration of the fault free digitally-calibrated circuit design;
simulate calibration of the fault free circuit design with the fault integrated into and analog portion of the digitally-calibrated circuit design;
simulate the fault free digitally-calibrated circuit design with a mixed signal circuit simulator from an initial circuit simulation time point until the end of the fault interval time period;
simulate the fault free digitally-calibrated circuit design with the fault from the beginning of the fault interval time period until the end of the fault interval time period; and
determine whether the fault is detectable.

16. The system of claim 15 wherein instructions to simulate the fault free digitally-calibrated circuit design with the fault from the beginning of the fault interval time period until the end of the fault interval time period comprise instructions to:
apply a calibration value for the fault free digitally-calibrated circuit design with the fault integrated into the digitally-calibrated circuit design.

17. The system of claim 16 wherein instructions to apply a calibration value for the fault free digitally-calibrated circuit design with the fault integrated into the digitally-calibrated circuit design comprise instructions to:
gradually introduce the calibration value over a period of time that is a fraction of the fault interval time period.

18. The system of claim 15 wherein the instructions further comprise instructions to:

pre-calibrate the fault free digitally-calibrated circuit design during the calibration interval; and pre-calibrate the fault free digitally-calibrated circuit design with the fault integrated into the digitally-calibrated circuit design during the calibration interval.

19. The system of claim 18 wherein the instructions further comprise instructions to:

compare a first circuit response at the end of the fault free digitally-calibrated circuit design pre-calibration with a second circuit response at the end of the fault free digitally-calibrated circuit design with the fault integrated into the circuit pre-calibration; and when the first circuit response is the same as the second circuit response, replacing the calibration of the fault free digitally-calibrated circuit design with the fault integrated into the circuit with the calibration of the fault free digitally-calibrated circuit design.

20. The system of claim 18 wherein instructions to pre-calibrating the fault free digitally-calibrated circuit design with the fault integrated into the digitally-calibrated circuit design during the calibration interval comprises instructions to:

use a circuit state from a pre-calibration of the fault free circuit design.

* * * * *